United States Patent
Li et al.

(10) Patent No.: US 10,487,988 B2
(45) Date of Patent: Nov. 26, 2019

(54) LED FILAMENT AND LED LIGHT BULB COMPRISING THE SAME

(71) Applicant: ZHEJIANG YANKON MEGA LIGHTING CO., LTD., Shaoxing (CN)

(72) Inventors: Yang Li, Shaoxing (CN); Hongqiang Xu, Shaoxing (CN); Jiadong Wang, Shaoxing (CN); Ting Ding, Shaoxing (CN)

(73) Assignee: ZHEJIANG YANKON MEGA LIGHTING CO., LTD., Shaoxing (CN)

( * ) Notice: Subject to any disclaimer, the term of this patent is extended or adjusted under 35 U.S.C. 154(b) by 397 days.

(21) Appl. No.: 15/397,695

(22) Filed: Jan. 3, 2017

(65) Prior Publication Data

US 2018/0045380 A1 Feb. 15, 2018

(30) Foreign Application Priority Data

Aug. 15, 2016 (CN) .......................... 2016 1 0670001

(51) Int. Cl.
| | |
|---|---|
| *F21K 9/237* | (2016.01) |
| *F21K 9/232* | (2016.01) |
| *F21K 9/235* | (2016.01) |
| *H05B 33/06* | (2006.01) |
| *F21K 9/238* | (2016.01) |

(Continued)

(52) U.S. Cl.
CPC ............. *F21K 9/237* (2016.08); *F21K 9/232* (2016.08); *F21K 9/235* (2016.08); *F21V 3/02* (2013.01); *H01L 25/00* (2013.01); *H05B 33/06* (2013.01); *F21K 9/238* (2016.08); *F21V 3/061* (2018.02); *F21V 29/506* (2015.01); *F21V 29/85* (2015.01);

(Continued)

(58) Field of Classification Search
CPC .............. H01L 25/075; H01L 25/0753; H05B 33/08–0872; F21V 23/004; F21V 23/003; F21K 9/23–278
See application file for complete search history.

(56) References Cited

U.S. PATENT DOCUMENTS

| | | | |
|---|---|---|---|
| 7,989,840 B2 * | 8/2011 | Sanpei .................... | F21V 31/04 257/100 |
| 9,714,757 B2 * | 7/2017 | Inobe ..................... | F21V 21/14 |

(Continued)

FOREIGN PATENT DOCUMENTS

CN 107763460 A * 3/2018

*Primary Examiner* — Mariceli Santiago
(74) *Attorney, Agent, or Firm* — Matthias Scholl, PC; Matthias Scholl (57) ABSTRACT

An LED filament, including: a strip substrate having two ends, a plurality of LED chips, metal strip electrodes, and a plurality of electronic devices. The plurality of LED chips is disposed on the strip substrate and connected in series to form an LED light source. The metal strip electrodes are disposed on the two ends of the strip substrate. The plurality of electronic devices is disposed on the strip substrate in the vicinity of one end of the strip substrate or in the vicinity of two ends of the strip substrate. The metal strip electrodes are connected to the electronic devices and the LED light source via leads. The strip substrate, the LED light source, the electronic devices, and joints between the strip substrate and the metal strip electrodes are coated with fluorescent glue.

6 Claims, 8 Drawing Sheets

(51) Int. Cl.
*F21V 3/06* (2018.01)
*F21V 3/02* (2006.01)
*H01L 25/00* (2006.01)
*F21Y 115/10* (2016.01)
*F21Y 107/00* (2016.01)
*F21V 29/506* (2015.01)
*F21V 29/85* (2015.01)

(52) U.S. Cl.
CPC ....... *F21Y 2107/00* (2016.08); *F21Y 2115/10* (2016.08)

(56) References Cited

U.S. PATENT DOCUMENTS

| | | | |
|---|---|---|---|
| 10,158,055 B2* | 12/2018 | Yao | H01L 33/60 |
| 2010/0181507 A1* | 7/2010 | Maruyama | H04N 1/02815 |
| | | | 250/552 |
| 2012/0162965 A1* | 6/2012 | Takeuchi | F21V 9/30 |
| | | | 362/84 |
| 2014/0362565 A1* | 12/2014 | Yao | H01L 25/0753 |
| | | | 362/223 |
| 2015/0003039 A1* | 1/2015 | Liu | F21K 9/00 |
| | | | 362/84 |
| 2015/0070871 A1* | 3/2015 | Chen | H01L 24/24 |
| | | | 362/84 |

\* cited by examiner

LED FILAMENT AND LED LIGHT BULB COMPRISING THE SAME

CROSS-REFERENCE TO RELATED APPLICATIONS

Pursuant to 35 U.S.C. § 119 and the Paris Convention Treaty, this application claims the benefit of Chinese Patent Application No. 201610670001.6 filed Aug. 15, 2016, the contents of which, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, and Cambridge, Mass. 02142.

BACKGROUND OF THE INVENTION

Field of the Invention

The invention relates to an LED filament and an LED light bulb comprising the same.

Description of the Related Art

Conventional LED filaments suffer from the following problems:

1. The strip substrate and LED chips are coated with fluorescent glue, while the metal strip electrodes are exposed, which means the metal strip electrodes are fragile and the connecting lead between the metal strip electrodes and the LED chips tends to break off during spot welding.

2. Conventional LED filaments are vulnerable to overcurrent or overvoltage or overheat resulting from switching the LEDs on and off.

3. Typically, a light bulb includes a plurality of LED filaments which are connected in series or in parallel. When one or more LED filaments stop working, overcurrent may be produced and flow through the other LEDs, shortening the service life of the light bulb.

SUMMARY OF THE INVENTION

In view of the above-described problems, it is one objective of the invention to provide an LED filament and an LED light bulb comprising the same that are free of the influence of overcurrent, overvoltage, and overheat, and have a relatively long serve life.

To achieve the above objective, in accordance with one embodiment of the invention, there is provided an LED filament. The LED filament comprises: a strip substrate, the strip substrate comprising two ends; a plurality of LED chips; metal strip electrodes; and a plurality of electronic devices adapted to conduct electricity, limit current, or protect an LED filament. The plurality of LED chips is disposed on the strip substrate and connected in series to form an LED light source. The metal strip electrodes are disposed on the two ends of the strip substrate. The plurality of electronic devices is disposed on the strip substrate in the vicinity of one end of the strip substrate or in the vicinity of the two ends of the strip substrate. The metal strip electrodes are connected to the electronic devices and the LED light source via leads. The strip substrate, the LED light source, the electronic devices, and joints between the strip substrate and the metal strip electrodes are coated with fluorescent glue.

In a class of this embodiment, the electronic devices are disposed on the strip substrate in the vicinity of the two ends. The electronic devices are conductive blocks. A welding spot area of each conductive block is larger than an electrode area of each LED chip. A first conductive block is disposed between a first metal strip electrode and the LED light source. A second conductive block is disposed between the LED light source and a second metal strip electrode. The first metal strip electrode, the first conductive block, the LED light source, the second conductive block, and the second metal strip electrode are connected in series via leads in that order. The electronic devices which are disposed on the strip substrate in the vicinity of two ends are conductive blocks. The LED light source is not directly connected to the metal strip electrode via conventional leads, instead, the LED light source is connected to the conductive blocks via conventional leads, and the conductive blocks are connected to the metal strip electrode via a lead having a larger lead wire diameter. Because the conductive blocks and the LED chips have similar sizes, and the welding spot area of the conductive block is larger than the electrode area of the LED chips, the conductive blocks can be connected to the metal strip electrode using leads having a larger lead wire diameter (the diameter is larger than 25 µm (1 mil)), while LED chips of the existing LED filament are directly connected to the metal strip electrode. Conventionally, because the LED chips have a small electrode area, the LED chips are connected to the metal strip electrode via leads having a smaller lead wire diameter (the diameter is smaller than 25 µm (1 mil)). Obviously, during the welding process, a connection using the leads having the larger lead wire diameter is more reliable than a connection using the leads having the smaller lead wire diameter, and the possibility of lead breakage is effectively reduced. The LED light source, the conductive block, and the metal strip electrode are connected in series, thus causing no adverse effect to the electrical connection between the LED light source and the metal strip electrode.

In a class of this embodiment, the first metal strip electrode is connected to the first conductive block via leads having the lead wire diameter of larger than 25 µm, and the second conductive block is connected to the second metal strip electrode via the leads having the lead wire diameter of larger than 25 µm. Each conductive block is a metallic conductive block, a non-metallic conductive block, or a conductive block containing a conductive layer. A welding surface of each conductive block is coated with a nickel layer or a silver layer. A lead wire diameter of conventional leads is smaller than 25 µm (1 mil), and LED chips of the existing LED filament are directly connected to the metal strip electrode via conventional leads. Optionally, the first metal strip electrode is connected to the first conductive block via a first metallic conductive member, and the second metal strip electrode is connected to the second conductive block via a second metallic conductive member. The metallic conductive block is a copper sheet, an aluminum sheet, or an iron sheet. The non-metallic conductive block is a silicon wafer. The conductive block containing conductive layer is a sapphire containing nitride. The welding surface of the conductive block is coated with the nickel layer or the silver layer, thus facilitating the welding of the leads on the conductive block.

In a class of this embodiment, one electronic device is disposed on the strip substrate in the vicinity of one end of the strip substrate. The electronic device is a Zener diode or a varistor. The Zener diode or the varistor is disposed between a first metal strip electrode and the LED light source. The first metal strip electrode, the LED light source, and a second metal strip electrode are connected in series via leads in that order, and the Zener diode or the varistor is connected in parallel to one LED chip via leads; or the LED chips are connected in series to form a light-emitting member, and the Zener diode or the varistor is connected in parallel to the light-emitting member via leads. The electronic device which is disposed on the strip substrate in the vicinity of one end is the Zener diode or the varistor, and the Zener diode or the varistor is connected in parallel to the LED chip, thus protecting the LED light source from electrostatic discharge or high voltage surges.

In a class of this embodiment, two electronic devices are disposed on the strip substrate in the vicinity of one end of the strip substrate. One electronic device is a first conductive block, and the other electronic device is a Zener diode or a varistor. A third electronic device is disposed on the strip substrate in the vicinity of the other end of the strip substrate. The third electronic device is a second conductive block. A welding spot area of each conductive block is larger than an electrode area of each LED chip. The first conductive block and the Zener diode or varistor are disposed between a first metal strip electrode and the LED light source, and the first conductive block is in the vicinity of the first metal strip electrode. The second conductive block is disposed between the LED light source and a second metal strip electrode. The first metal strip electrode, the first conductive block, the LED light source, the second conductive block, and the second metal strip electrode are connected in series via leads in that order, and the Zener diode or the varistor is connected in parallel to one LED chip via leads; or the LED chips are connected in series to form a light-emitting member, and the Zener diode or the varistor is connected in parallel to the light-emitting member via leads. Because two conductive blocks are provided and are connected to the metal strip electrodes via leads, and the Zener diode or the varistor is provided and is connected in parallel to the LED chip, on the one hand, the conductive blocks can be connected to the metal strip electrode via leads having a larger lead wire diameter, and the possibility of lead breakage is effectively reduced; on the other hand, the LED light source is protected from electrostatic discharge or high voltage surges.

In a class of this embodiment, one electronic device is disposed on the strip substrate in the vicinity of one end of the strip substrate. The electronic device is a current-limiting chip. The current-limiting chip is disposed between a first metal strip electrode and the LED light source. The first metal strip electrode, the current-limiting chip, the LED light source, and a second metal strip electrode are connected in series via leads in that order. The current-limiting chip is disposed on the strip substrate in the vicinity of one end of the strip substrate, and is connected in series to the LED chip, thus protecting the LED chip from overcurrent impact; or the working current of the LED filament is limited within a threshold value, and the reduction in service life or burnout of the LED filament caused by overcurrent is effectively avoided. The current-limiting chip is commonly used current-limiting chip in the prior art.

In a class of this embodiment, two electronic devices are disposed on the strip substrate in the vicinity of one end of the strip substrate. One electronic device is a first conductive block, and the other electronic device is a current-limiting chip. A third electronic device is disposed on the strip substrate in the vicinity of the other end of the strip substrate. The third electronic device is a second conductive block. A welding spot area of each conductive block is larger than an electrode area of each LED chip. The first conductive block and the current-limiting chip are disposed between a first metal strip electrode and the LED light source, and the first conductive block is adjacent to the first metal strip electrode. The second conductive block is disposed between the LED light source and the second metal strip electrode. The first metal strip electrode, the first conductive block, the current-limiting chip, the LED light source, the second conductive block, and a second metal strip electrode are connected in series via leads in that order. Because two conductive blocks are provided and are connected to the metal strip electrodes via leads, and the current-limiting chip is provided and is connected to the conductive blocks and to the LED light source via leads, on the one hand, the conductive blocks can be connected to the metal strip electrode via leads having a larger lead wire diameter, and the possibility of lead breakage is effectively reduced; on the other hand, the LED chip is protected from overcurrent impact; or the working current of the LED filament is limited within a threshold value, and the reduction in service life or burnout of the LED filament caused by overcurrent is effectively avoided.

In a class of this embodiment, one electronic device is disposed on the strip substrate in the vicinity of one end of the strip substrate. The electronic device is a thermistor. The thermistor is disposed between a first metal strip electrode and the LED light source. The first metal strip electrode, the thermistor, the LED light source, and a second metal strip electrode are connected in series via leads in that order. Because the thermistor is disposed on the strip substrate in the vicinity of one end of the strip substrate, and is connected in series to the LED chip, when the LED filament overheats, the resistance of the thermistor rises and the current in the LED filament is decreased, thus the temperature is decreased, and the service life of the LED filament is prolonged.

In a class of this embodiment, two electronic devices are disposed on the strip substrate in the vicinity of one end of the strip substrate. One electronic device is a first conductive block, and the other electronic device is a thermistor. A third electronic device is disposed on the strip substrate in the vicinity of the other end of the strip substrate. The third electronic device is a second conductive block. A welding spot area of each conductive block is larger than an electrode area of each LED chip. The first conductive block and the thermistor are disposed between a first metal strip electrode and the LED light source, and the first conductive block is adjacent to the first metal strip electrode. The second conductive block is disposed between the LED light source and a second metal strip electrode. The first metal strip electrode, the first conductive block, the thermistor, the LED light source, the second conductive block, and the second metal strip electrode are connected in series via leads in that order. Because two conductive blocks are provided and are connected to the metal strip electrodes via leads, and the thermistor is provided and is connected to the conductive blocks and to the LED light source via leads, on the one hand, the conductive blocks can be connected to the metal strip electrode via leads having a larger lead wire diameter, and the possibility of lead breakage is effectively reduced; on the other hand, when the LED filament overheats, the resistance of the thermistor rises and the current in the LED filament is decreased, thus the temperature is decreased, and the service life of the LED filament is prolonged.

In accordance with another embodiment of the invention, there is provided an LED light bulb comprising the LED filament. The LED light bulb comprises an LED drive power and an LED luminous body. The LED luminous body is connected to the LED drive power. The LED luminous body comprises one LED filament; or the LED luminous body comprises a plurality of the LED filaments connected in series or in parallel.

Advantages of the LED filament and the LED light bulb according to embodiments of the invention are summarized as follows:

1. A plurality of electronic devices is disposed on the strip substrate in the vicinity of one end or in the vicinity of two ends, and the electronic devices are adapted to conduct electricity, limit current, or protect the LED filament. When the electronic device is adapted to conduct electricity, the electronic device is directly connected to the metal strip electrode, because the electronic device which conducts electricity, such as a conductive block, has a relatively large welding spot area, the electronic device can be connected to the metal strip electrode via a lead having a larger lead wire diameter or via a metal conductive member, and the connection is more reliable. The breakage of the lead between the LED light source and the metal strip electrode is effectively avoided. When the electronic device is adapted to limit current, the working current of the LED filament is limited within a threshold value, and no overcurrent is generated in the LED filament. When the electronic device is adapted to protect the LED filament, the adverse influence of overcurrent and overvoltage on the LED filament is prevented; or when the LED filament overheats, the electronic device is adapted to reduce the current in the LED filament, thus the temperature is decreased, and the service life of the LED filament is prolonged.

2. A plurality of electronic devices having different functions is disposed on the strip substrate, for example, the electronic device which is adapted to conduct electricity and the electronic device which is adapted to limit current are disposed on the strip substrate; or the electronic device which is adapted to conduct electricity and the electronic device which is adapted to protect the LED filament are disposed on the strip substrate; or the electronic device which is adapted to limit current and the electronic device which is adapted to protect the LED filament are disposed on the strip substrate; or the electronic device which is adapted to conduct electricity, the electronic device which is adapted to limit current, and the electronic device which is adapted to protect the LED filament are disposed on the strip substrate. Thus, the LED filament in the embodiments of the invention has better luminescence performance

BRIEF DESCRIPTION OF THE DRAWINGS

The invention is described hereinbelow with reference to the accompanying drawings, in which.

DETAILED DESCRIPTION OF THE EMBODIMENTS

For further illustrating the invention, experiments detailing an LED filament and an LED light bulb comprising the same are described below. It should be noted that the following examples are intended to describe and not to limit the invention.

EXAMPLE 1

Figure 1:
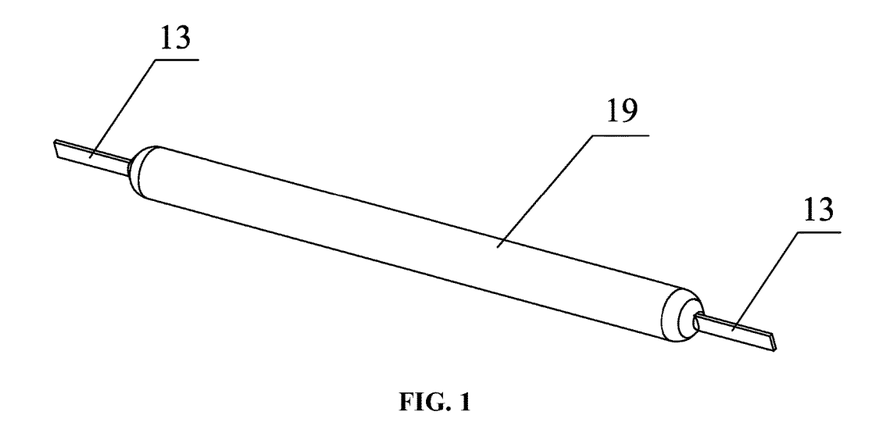
FIG. 1 is a schematic diagram of an LED filament in Examples 1-7.
Figure 2:
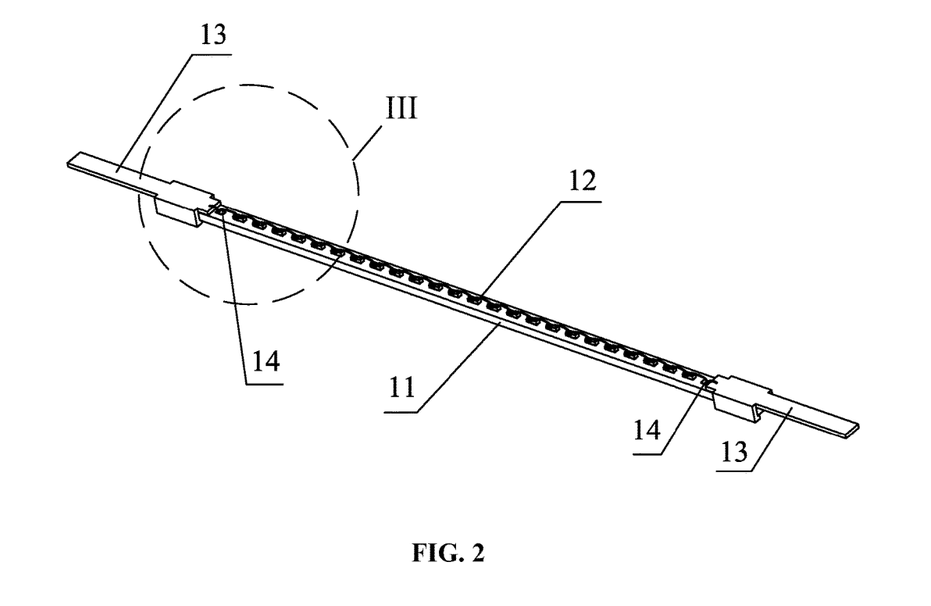
FIG. 2 is a schematic diagram of an LED filament prior to coating fluorescent glue in Example 1.
Figure 3:
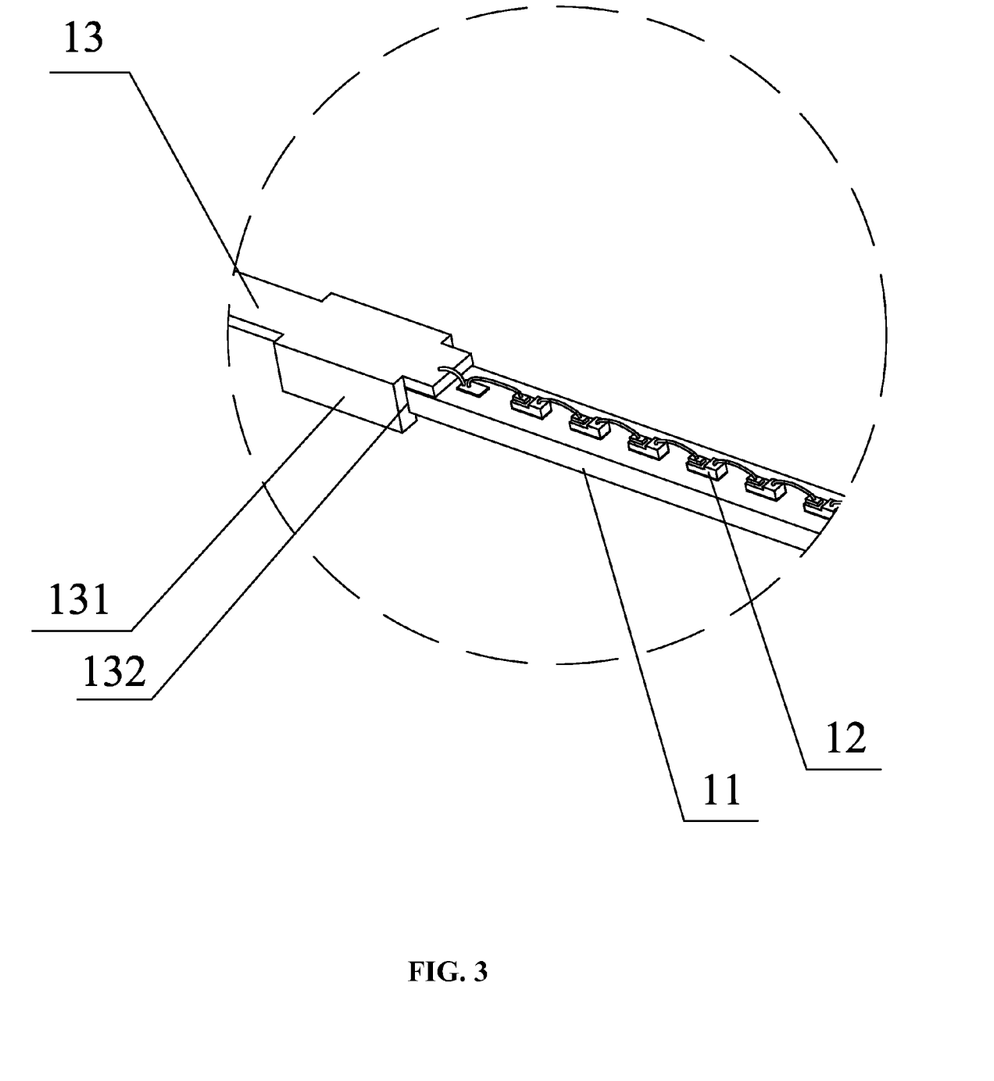
FIG. 3 is a partial enlarged view taken from part III in FIG. 2.

As shown in FIGS. 1-3, an LED filament comprises a strip substrate 11 and a plurality of LED chips 12. The LED chips are uniformly disposed on the strip substrate 11. Metal strip electrodes 13 are disposed on two ends of the strip substrate 11. The LED chips 12 are connected in series to form an LED light source. The electronic devices are disposed on the strip substrate 11 in the vicinity of two ends of the strip substrate 11. The electronic devices are conductive blocks 14. A welding spot area of each conductive block 14 is larger than an electrode area of each LED chip 12. A first conductive block 14 is disposed between a first metal strip electrode 13 and the LED light source. A second conductive block 14 is disposed between the LED light source and a second metal strip electrode 13. The first metal strip electrode 13, the first conductive block 14, the LED light source, the second conductive block 14, and the second metal strip electrode 13 are connected in series via leads in that order. The strip substrate 11, the LED light source, the conductive blocks 14, and joints between the strip substrate 11 and the metal strip electrodes 13 are coated with fluorescent glue 19. The conductive blocks 14 are disposed on the strip substrate 11 in the vicinity of two ends. The LED light source is not directly connected to the metal strip electrode 13 via conventional leads, instead, the LED light source is connected to the conductive blocks 14 via conventional leads, and the conductive blocks 14 are connected to the metal strip electrode 13 via a lead having a larger lead wire diameter. Because the conductive blocks 14 and the LED chips 12 have similar sizes, and the welding spot area of the conductive block 14 is larger than the electrode area of the LED chips 12, the conductive blocks 14 can be connected to the metal strip electrode 13 using leads having a larger lead wire diameter (the diameter is larger than 25 μm (1 mil)), while LED chips of the existing LED filament are directly connected to the metal strip electrode. Because the LED chips have a small electrode area, the LED chips are connected to the metal strip electrode via leads having a smaller lead wire diameter (the diameter is smaller than 25 μm (1 mil)). Obviously, during the welding process, a connection using the leads having the larger lead wire diameter is more reliable than a connection using the leads having the smaller lead wire diameter, and the lead which is connected to metal strip electrode 13 is less likely to break. The LED light source, the conductive block 14, and the metal strip electrode 13 are connected in series, thus causing no adverse effect to the electrical connection between the LED light source and the metal strip electrode 13.

Figure 4:
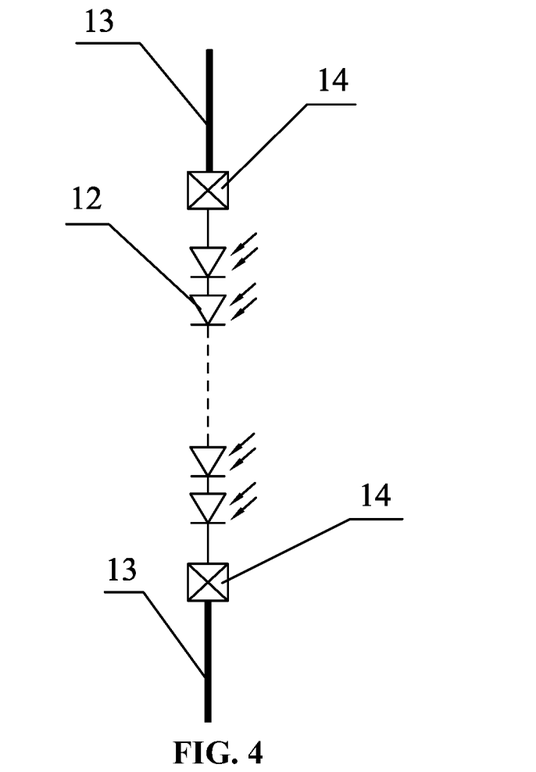
FIG. 4 is a diagram showing a connection between LED chips, electronic devices, and metal strip electrodes of an LED filament in Example 1.

FIG. 4 is a diagram showing a connection between LED chips, conductive blocks, and metal strip electrodes of an LED filament. The LED chips 12 are connected in series, and a cathode of the LED chips 12 on one end is connected to the first conductive block 14 which is connected to the first metal strip electrode 13. The first metal strip electrode 13 is used as the negative electrode. An anode of the LED chips 12 on the other end is connected to the second conductive block 14. The second conductive block 14 is connected to the second metal strip electrode 13. The second metal strip electrode is used as the positive electrode.

In the example, the first metal strip electrode 13 is connected to the first conductive block 14 via the lead having the lead wire diameter of larger than 25 μm, and the second conductive block 14 is connected to the second metal strip electrode 13 via the lead having the lead wire diameter of larger than 25 μm. The lead wire diameter of conventional leads is smaller than 25 μm (1 mil), and LED chips of the existing LED filament are directly connected to the metal strip electrode via conventional leads. Optionally, the first metal strip electrode 13 is connected to the first conductive block 14 via the metallic conductive member, and the second metal strip electrode 13 is connected to the second conductive block 14 via the metallic conductive member.

In the example, the conductive block 14 is a metallic conductive block, a non-metallic conductive block, or a conductive block containing a conductive layer. A welding surface of the conductive block 14 is coated with a nickel layer or a silver layer. The metallic conductive block is a copper sheet, an aluminum sheet, or an iron sheet. The non-metallic conductive block is a silicon wafer. The conductive block containing conductive layer is a sapphire containing nitride. The welding surface of the conductive block 14 is coated with the nickel layer or the silver layer, thus facilitating the welding of the leads on the conductive block 14.

EXAMPLE 2

Figure 5:
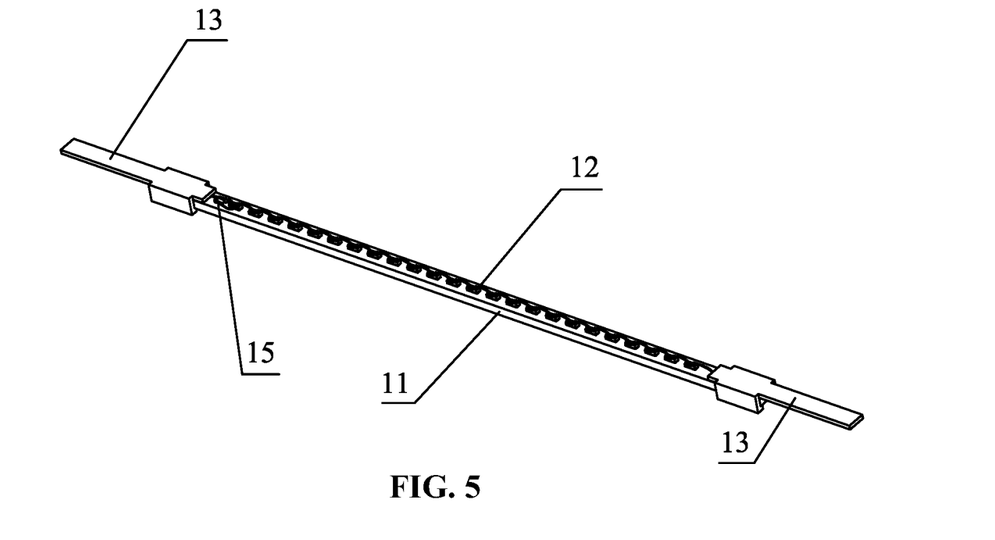
FIG. 5 is a schematic diagram of an LED filament prior to coating fluorescent glue in Example 2.

As shown in FIG. 5, an LED filament comprises a strip substrate 11 and a plurality of LED chips 12. The LED chips are uniformly disposed on the strip substrate 11. Metal strip electrodes 13 are disposed on two ends of the strip substrate 11. The LED chips 12 are connected in series to form an LED light source. One electronic device is disposed on the strip substrate 11 in the vicinity of one end of the strip substrate. The electronic device is adapted to protect the LED filament, and the electronic device is a varistor 15. The varistor 15 is disposed between a first metal strip electrode 13 and the LED light source. The first metal strip electrode 13, the LED light source, and the second metal strip electrode 13 are connected in series via leads in that order, and the varistor 15 is connected in parallel to one LED chip 12 via leads. The strip substrate 11, the LED light source, the varistor 15, and joints between the strip substrate 11 and the metal strip electrodes 13 are coated with fluorescent glue 19 (as shown in FIG. 1). The electronic device which is disposed on the strip substrate 11 in the vicinity of one end of the strip substrate is the varistor 15, and the varistor 15 is connected in parallel to the LED chip 12, thus protecting the LED light source from electrostatic discharge or high voltage surges.

Figure 6:
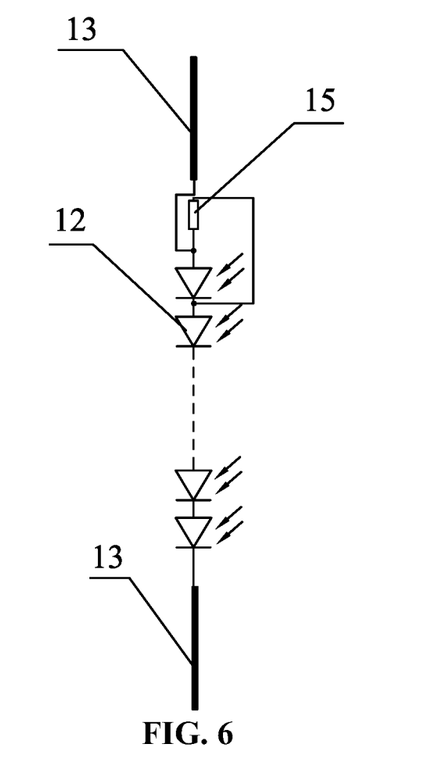
FIG. 6 is a diagram showing a connection between LED chips, an electronic device, and metal strip electrodes of an LED filament in Example 2.

FIG. 6 is a diagram showing a connection between LED chips, the varistor, and metal strip electrodes of an LED filament. The LED chips 12 are connected in series, and a cathode of the LED chips 12 on one end of the strip substrate is connected to the second metal strip electrode 13. The second metal strip electrode is used as the negative electrode. An anode of the LED chips 12 on the other end is connected to the first metal strip electrode 13. The first metal strip electrode is used as the positive electrode. The varistor 15 is connected in parallel to one LED chip 12.

In the specific design, the varistor 15 can be replaced by the Zener diode which features the same function.

In the specific design, optionally, the LED chips 12 are connected in series to form a light-emitting member, and the Zener diode or the varistor 15 is connected in parallel to the light-emitting member via leads. However, the connection is complex.

EXAMPLE 3

Figure 7:
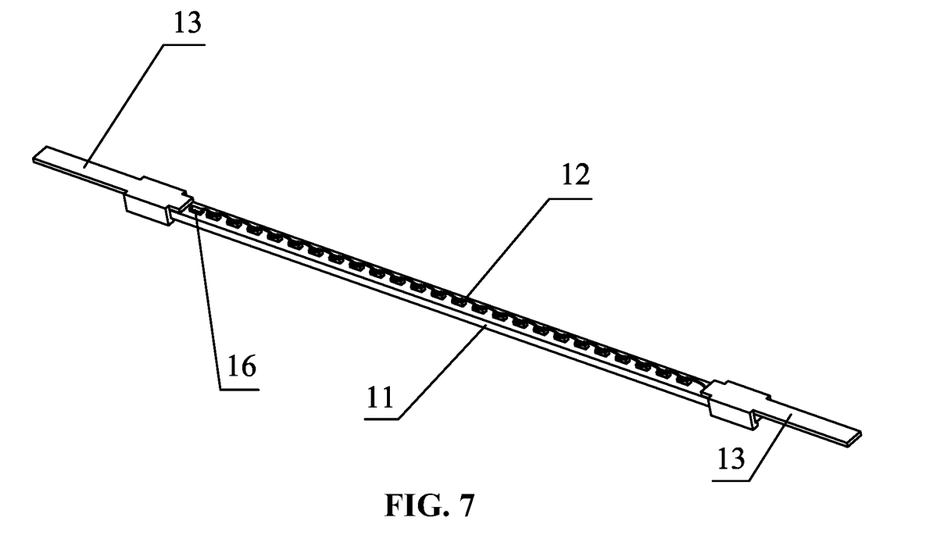
FIG. 7 is a schematic diagram of an LED filament prior to coating fluorescent glue in Example 3.

As shown in FIG. 7, an LED filament comprises a strip substrate 11 and a plurality of LED chips 12. The LED chips are uniformly disposed on the strip substrate 11. Metal strip electrodes 13 are disposed on two ends of the strip substrate 11. The LED chips 12 are connected in series to form an LED light source. One electronic device is disposed on the strip substrate in the vicinity of one end of the strip substrate. The electronic device is a current-limiting chip 16. The current-limiting chip 16 is disposed between a first metal strip electrode 13 and the LED light source. The first metal strip electrode 13, the current-limiting chip 16, the LED light source, and a second metal strip electrode 13 are connected in series via leads in that order. The strip substrate 11, the LED light source, the current-limiting chip 16, and joints between the strip substrate 11 and the metal strip electrodes 13 are coated with fluorescent glue 19 (as shown in FIG. 1). The current-limiting chip 16 is disposed on the strip substrate 11 in the vicinity of one end of the strip substrate, and is connected in series to the LED chip 12, thus protecting the LED chip 12 from overcurrent impact; or the working current of the LED filament is limited within a threshold value, and the reduction in service life or burnout of the LED filament caused by overcurrent is effectively avoided.

Figure 8:
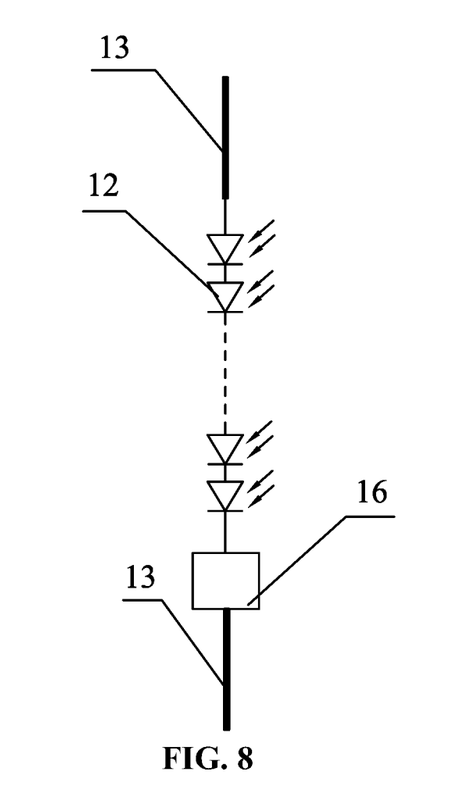
FIG. 8 is a diagram showing a connection between LED chips, an electronic device, and metal strip electrodes of an LED filament in Example 3.

FIG. 8 is a diagram showing a connection between LED chips, the current-limiting chip, and metal strip electrodes of an LED filament. The LED chips 12 are connected in series, and a cathode of the LED chips 12 on one end of the strip substrate is connected to the current-limiting chip 16. The current-limiting chip 16 is connected to the first metal strip electrode 13. The first metal strip electrode is used as the negative electrode. An anode of the LED chips 12 on the other end is connected to the second metal strip electrode 13. The second metal strip electrode is used as the positive electrode.

In the example, the current-limiting chip 16 uses the commonly used current-limiting chip 16 in the prior art which comprises a plurality of electronic components such as MOS transistor, current sensing resistor, and Zener diode. As the target current is set up, the Zener diode and the current sensing resistor work together to limit the working current of the LED filament within the target current; or as the working current of the LED filament is maintained at the target current level, the current in the LED filament is limited.

EXAMPLE 4

Figure 9:
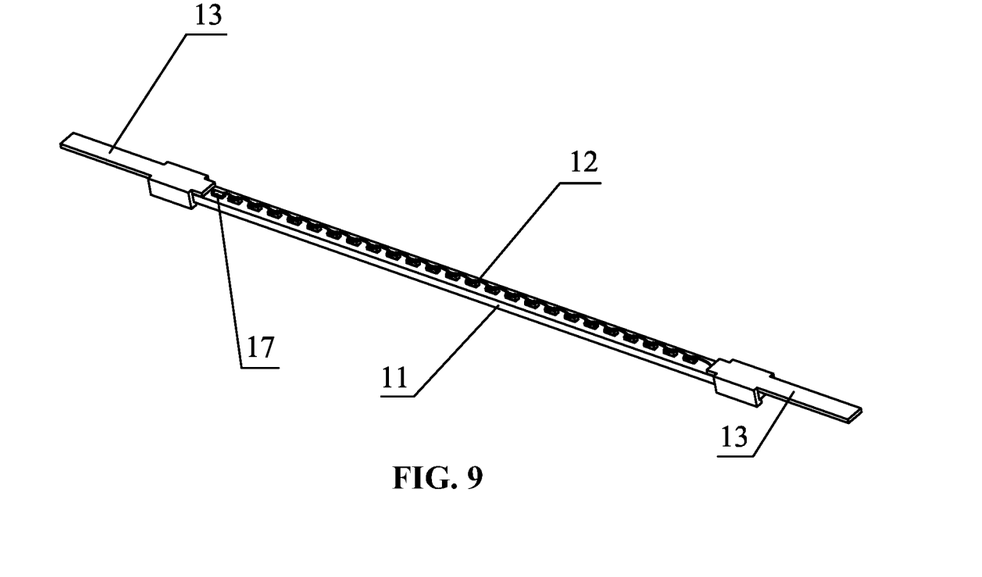
FIG. 9 is a schematic diagram of an LED filament prior to coating fluorescent glue in Example 4.

As shown in FIG. 9, an LED filament comprises a strip substrate 11 and a plurality of LED chips 12. The LED chips are uniformly disposed on the strip substrate 11. Metal strip electrodes 13 are disposed on two ends of the strip substrate 11. The LED chips 12 are connected in series to form an LED light source. One electronic device is disposed on the strip substrate 11 in the vicinity of one end of the strip substrate. The electronic device is adapted to protect the LED filament, and the electronic device is a thermistor 17. The thermistor 17 is disposed between a first metal strip electrode 13 and the LED light source. The first metal strip electrode 13, the thermistor 17, the LED light source, and a second metal strip electrode 13 are connected in series via leads in that order. The strip substrate 11, the LED light source, the thermistor 17, and joints between the strip substrate 11 and the metal strip electrodes 13 are coated with fluorescent glue 19 (as shown in FIG. 1). Because the thermistor 17 is disposed on the strip substrate 11 in the vicinity of one end of the strip substrate, and the thermistor 17 is connected in series to the LED chip 12, when the LED filament overheats, the resistance of the thermistor 17 rises and the current in the LED filament is decreased, thus the temperature is decreased, and the service life of the LED filament is prolonged. In other words, as a target temperature is set up, the thermistor 17 is adapted to prevent the LED filament from being too hot.

Figure 10:
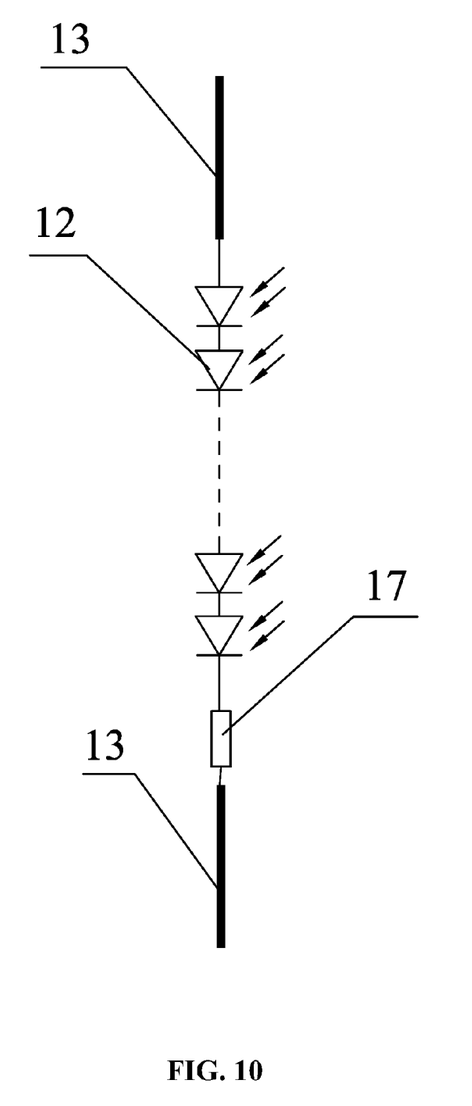
FIG. 10 is a diagram showing a connection between LED chips, an electronic device, and metal strip electrodes of an LED filament in Example 4.

FIG. 10 is a diagram showing a connection between LED chips, the thermistor, and metal strip electrodes of an LED filament. The LED chips 12 are connected in series, and a cathode of the LED chips 12 on one end of the strip substrate is connected to the thermistor 17. The thermistor 17 is connected to the first metal strip electrode 13. The first metal strip electrode is used as the negative electrode. An anode of the LED chips 12 on the other end is connected to the second metal strip electrode 13. The second metal strip electrode is used as the positive electrode.

EXAMPLE 5

Figure 11:
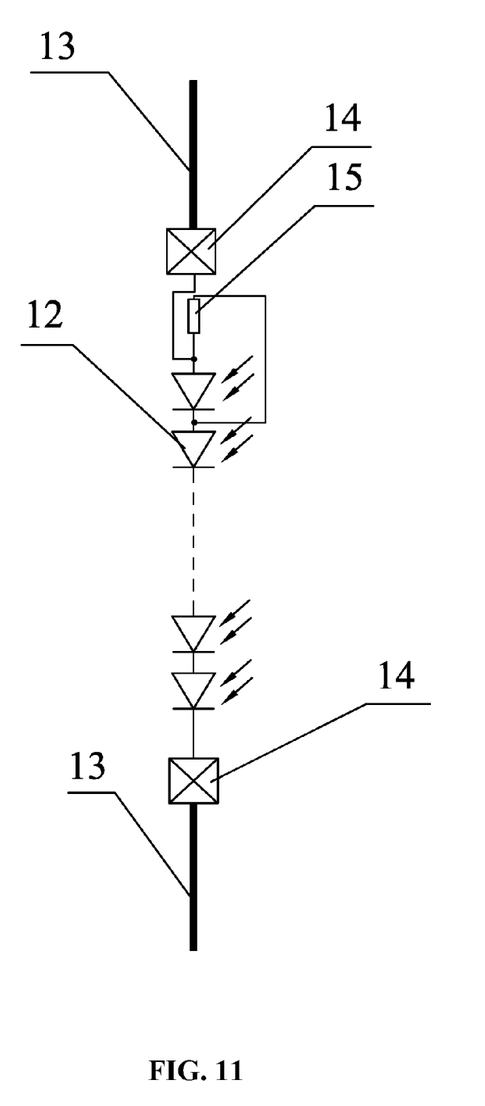
FIG. 11 is a diagram showing a connection between LED chips, electronic devices, and metal strip electrodes of an LED filament in Example 5.

An LED filament comprises a strip substrate 11 and a plurality of LED chips 12. The LED chips are uniformly disposed on the strip substrate 11. Metal strip electrodes 13 are disposed on two ends of the strip substrate 11. The LED chips 12 are connected in series to form an LED light source. Two electronic devices are disposed on the strip substrate 11 in the vicinity of one end of the strip substrate. One electronic device is a first conductive block 14 which is adapted to conduct electricity, and the other electronic device is a varistor 15 which is adapted to protect the LED filament. A third electronic device is disposed on the strip substrate 11 in the vicinity of another end. The third electronic device is a second conductive block 14 which is adapted to conduct electricity. A welding spot area of each conductive block 14 is larger than an electrode area of each LED chip 12. The first conductive block 14 and the varistor 15 are disposed between a first metal strip electrode 13 and the LED light source, and the first conductive block 14 is adjacent to the first metal strip electrode 13. The second conductive block 14 is disposed between the LED light source and a second metal strip electrode 13. The first metal strip electrode 13, the first conductive block 14, the LED light source, the second conductive block 14, and the second metal strip electrode 13 are connected in series via leads in that order, and the varistor 15 is connected in parallel to one LED chip 12 via leads. The strip substrate 11, the LED light source, the conductive blocks 14, the varistor 15, and joints between the strip substrate 11 and the metal strip electrodes 13 are coated with fluorescent glue 19. The positions and connections of the strip substrate 11, the LED chips 12, the metal strip electrode 13, and the fluorescent glue 19 are shown in FIGS. 1-2. A connection of the LED chips 12, the electronic devices, and the metal strip electrodes 13 are shown in FIG. 11. Because two conductive blocks 14 are provided and the conductive blocks 14 are connected to the metal strip electrodes 13 via leads, and the varistor 15 is provided and the varistor 15 is connected in parallel to the LED chip 12, on the one hand, the conductive blocks 14 can be connected to the metal strip electrode 13 via leads having a larger lead wire diameter, and the lead which is connected to metal strip electrode 13 is less likely to break; on the other hand, the LED light source is protected from electrostatic discharge or high voltage surges.

FIG. 11 is a diagram showing a connection between LED chips, the conductive blocks, the varistor, and metal strip electrodes of an LED filament. The LED chips 12 are connected in series, and a cathode of the LED chips 12 on one end of the strip substrate is connected to the second conductive block 14. The second conductive block 14 is connected to the second metal strip electrode 13. The second metal strip electrode is used as the negative electrode. An anode of the LED chips 12 on the other end is connected to the first conductive block 14. The first conductive 14 is connected to the first metal strip electrode 13. The first metal strip electrode is used as the positive electrode. The varistor 15 is connected in parallel to one LED chip 12.

In the specific design, the varistor 15 can be replaced by the Zener diode which features the same function.

In the specific design, optionally, the LED chips 12 are connected in series to form a light-emitting member, and the Zener diode or the varistor 15 is connected in parallel to the light-emitting member via leads. However, the connection is complex.

EXAMPLE 6

Figure 12:
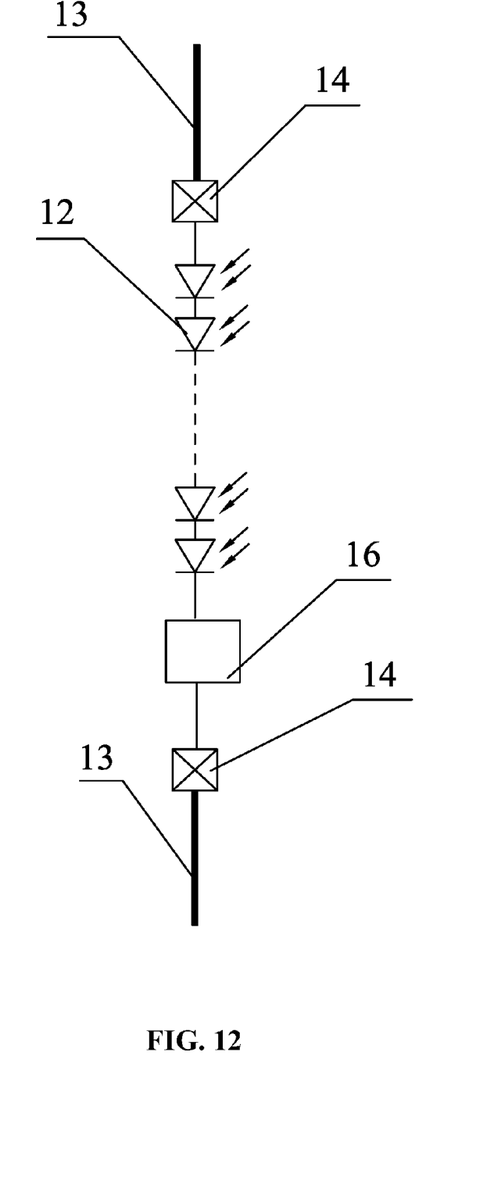
FIG. 12 is a diagram showing a connection between LED chips, electronic devices, and metal strip electrodes of an LED filament in Example 6.

An LED filament comprises a strip substrate 11 and a plurality of LED chips 12. The LED chips are uniformly disposed on the strip substrate 11. Metal strip electrodes 13 are disposed on two ends of the strip substrate 11. The LED chips 12 are connected in series to form an LED light source. Two electronic devices are disposed on the strip substrate 11 in the vicinity of one end of the strip substrate. One electronic device is a first conductive block 14 which is adapted to conduct electricity, and the other electronic device is a current-limiting chip 16 which is adapted to limit the current. A third electronic device is disposed on the strip substrate 11 in the vicinity of another end. The third electronic device is a second conductive block 14 which is adapted to conduct electricity. A welding spot area of each conductive block 14 is larger than an electrode area of each LED chip 12. The first conductive block 14 and the current-limiting chip 16 are disposed between a first metal strip electrode 13 and the LED light source, and the first conductive block 14 is adjacent to the first metal strip electrode 13. The second conductive block 14 is disposed between the LED light source and a second metal strip electrode 13. The first metal strip electrode 13, the first conductive block 14, the current-limiting block 16, the LED light source, the second conductive block 14, and the second metal strip electrode 13 are connected in series via leads in that order. The strip substrate 11, the LED light source, the conductive blocks 14, the current-limiting chip 16, and joints between the strip substrate 11 and the metal strip electrodes 13 are coated with fluorescent glue 19. The positions and connections of the strip substrate 11, the LED chips 12, the metal strip electrode 13, and the fluorescent glue 19 are shown in FIGS. 1-2. A connection of the LED chips 12, the electronic devices, and the metal strip electrodes 13 are shown in FIG. 12. Because two conductive blocks 14 are provided and the conductive blocks 14 are connected to the metal strip electrodes 13 via leads, and the current-limiting chip 16 is provided and is connected to the conductive block 14 and the LED light source via leads, on the one hand, the conductive blocks 14 can be connected to the metal strip electrode 13 via leads having a larger lead wire diameter, and the lead which is connected to metal strip electrode 13 is less likely to break; on the other hand, the LED chip 12 is protected from overcurrent impact; or the working current of the LED filament is limited within a threshold value, and the reduction in service life or burnout of the LED filament caused by overcurrent is effectively avoided.

FIG. 12 is a diagram showing a connection between LED chips, the conductive blocks, the current-limiting chip, and metal strip electrodes of an LED filament. The LED chips 12 are connected in series, and a cathode of the LED chips 12 on one end of the strip substrate is connected to the current-limiting block 16. The current-limiting block 16 is connected to the first conductive block 14. The first conductive block 14 is connected to the first metal strip electrode 13. The first metal strip electrode is used as the negative electrode. An anode of the LED chips 12 on the other end is connected to the second conductive block 14. The second conductive block 14 is connected to the second metal strip electrode 13. The second metal strip electrode is used as the positive electrode.

EXAMPLE 7

Figure 13:
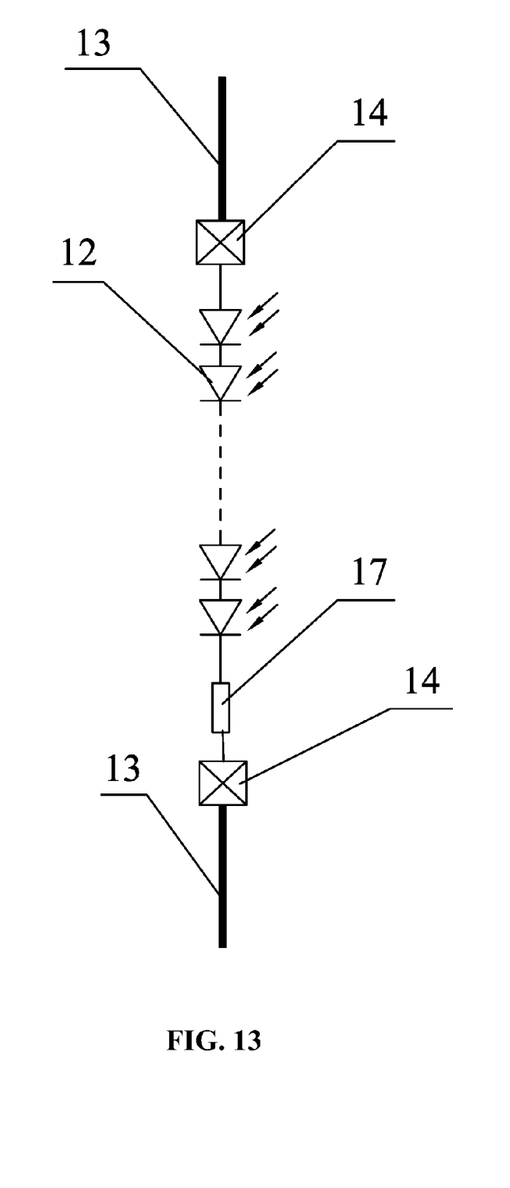
FIG. 13 is a diagram showing a connection between LED chips, electronic devices, and metal strip electrodes of an LED filament in Example 7.

An LED filament comprises a strip substrate 11 and a plurality of LED chips 12. The LED chips are uniformly disposed on the strip substrate 11. Metal strip electrodes 13 are disposed on two ends of the strip substrate 11. The LED chips 12 are connected in series to form an LED light source. Two electronic devices are disposed on the strip substrate 11 in the vicinity of one end of the strip substrate. One electronic device is a first conductive block 14 which is adapted to conduct electricity, and the other electronic device is a thermistor 17 which is adapted to protect the LED filament. A third electronic device is disposed on the strip substrate 11 in the vicinity of another end. The third electronic device is a second conductive block 14 which is adapted to conduct electricity. A welding spot area of each conductive block 14 is larger than an electrode area of each LED chip 12. The first conductive block 14 and the thermistor 17 are disposed between a first metal strip electrode 13 and the LED light source, and the first conductive block 14 is adjacent to the first metal strip electrode 13. The second conductive block 14 is disposed between the LED light source and a second metal strip electrode 13. The first metal strip electrode 13, the first conductive block 14, the thermistor 17, the LED light source, the second conductive block 14, and the second metal strip electrode 13 are connected in series via leads in that order. The strip substrate 11, the LED light source, the conductive blocks 14, the thermistor 17, and joints between the strip substrate 11 and the metal strip electrodes 13 are coated with fluorescent glue 19. The positions and connections of the strip substrate 11, the LED chips 12, the metal strip electrode 13, and the fluorescent glue 19 are shown in FIGS. 1-2. A connection of the LED chips 12, the electronic devices, and the metal strip electrodes 13 are shown in FIG. 13. Because two conductive blocks 14 are provided and the conductive blocks 14 are connected to the metal strip electrodes 13 via leads, and the thermistor 17 is provided and the thermistor 17 is connected to the conductive block 14 and the LED light source via leads, on the one hand, the conductive blocks 14 can be connected to the metal strip electrode 13 via leads having a larger lead wire diameter, and the lead which is connected to metal strip electrode 13 is less likely to break; on the other hand, when the LED filament overheats, the resistance of the thermistor 17 rises and the current in the LED filament is decreased, thus the temperature is decreased, and the service life of the LED filament is prolonged.

FIG. 13 is a diagram showing a connection between LED chips, the conductive blocks, the thermistor, and metal strip electrodes of an LED filament. The LED chips 12 are connected in series, and a cathode of the LED chips 12 on one end of the strip substrate is connected to the thermistor 17. The thermistor 17 is connected to the first conductive block 14. The first conductive block 14 is connected to the first metal strip electrode 13. The first metal strip electrode is used as the negative electrode. An anode of the LED chips 12 on the other end is connected to the second conductive block 14. The conductive block 14 is connected to the second metal strip electrode 13. The second metal strip electrode is used as the positive electrode.

EXAMPLE 8

Figure 14:
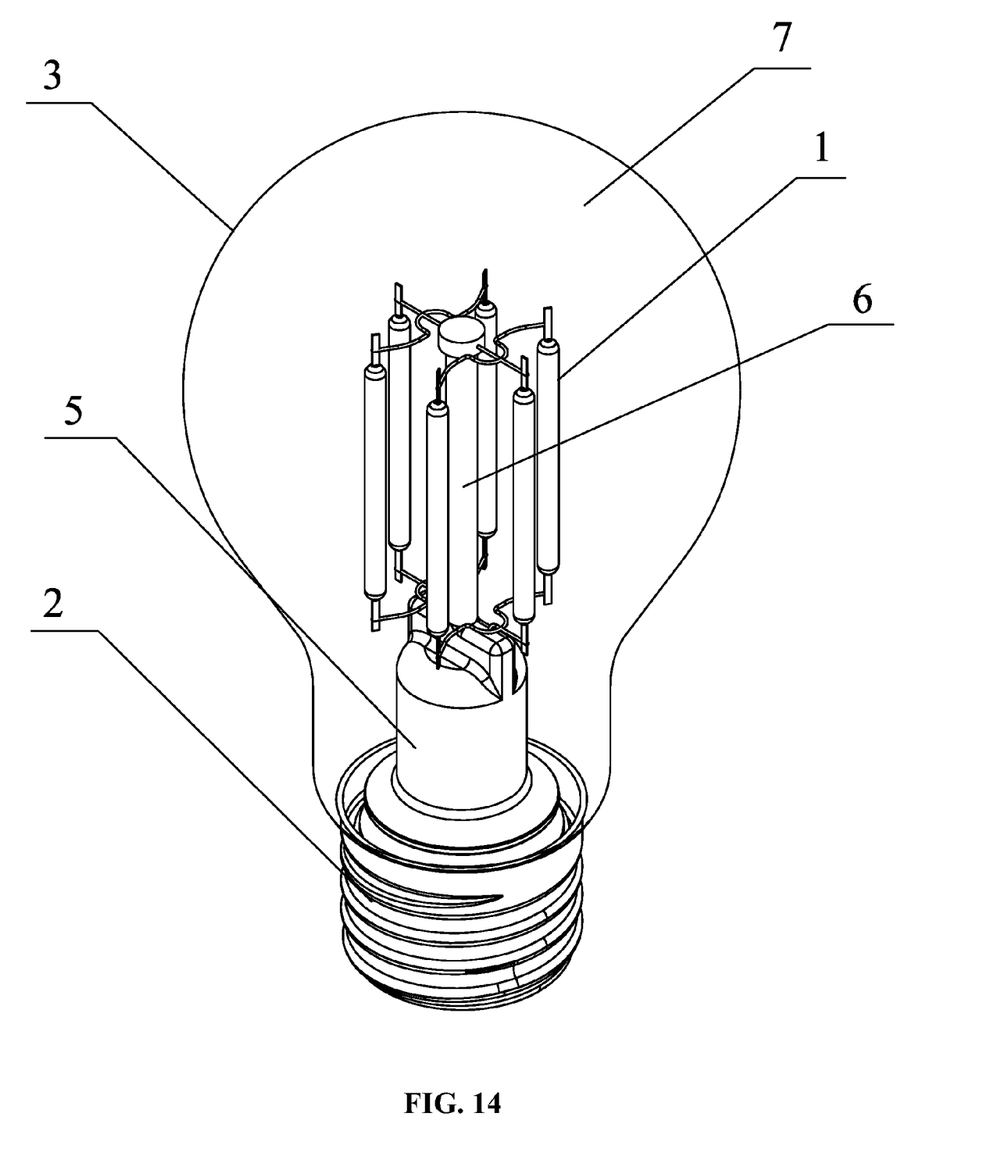
FIG. 14 is a schematic diagram of an LED light bulb in Example 8.

As shown in FIG. 14, an LED light bulb comprises a bulb holder 2, a glass bulb 3, an LED drive power (not shown) which is disposed in the bulb holder 2, a column 5, and an LED luminous body 1. The LED luminous body comprises six LED filaments. The LED filaments are connected in parallel or in series via spot welding to form the LED luminous body. A top of the column 5 is provided with a carrier 6. The LED luminous body 1 is mounted on the carrier 6. The column which is loaded with the LED luminous body 1 is disposed in the glass bulb 3, and a sealed chamber 7 is formed in the glass bulb 3. The sealed chamber 7 is filled with dry air, inert gas (such as nitrogen and argon), or thermal transfer gas (such as helium and hydrogen). The LED luminous body 1 is connected to the LED drive power in the bulb holder 2 via leads in the column 5. The bulb holder 2 is bonded with the glass bulb 3. The electronic devices in the LED filaments of the LED luminous body 1 have different functions, thus bringing different effects. A plurality of LED filaments is connected via spot welding. When the electronic devices are conductive blocks, adverse impact brought by the spot welding on the LED filament is reduced, thus the assembly yield of the LED light bulb is improved. When the electronic devices are a Zener diode or a varistor, the LED filament is protected from electrostatic discharge or high voltage surges. When the electronic devices are current-limiting chips, the LED filament is protected from the overcurrent impact. When the electronic devices are thermistors, the thermistors are adapted to prevent the LED filament from being too hot.

In the Examples 1-7, the electronic devices are disposed on the strip substrate 11 in the vicinity of one end of the strip substrate. Optionally, the electronic devices are disposed at other positions on the strip substrate 11; however, consequently, dark spots tend to be generated at the corresponding position, resulting in nonuniform light emitting. The electronic devices are the conductive block, the Zener diode, the varistor, the current-limiting chip, and the thermistor. Optionally, the electronic devices are other devices which have the same functions. Besides the Examples 1-7, a combination of an electronic device which is adapted to limit current and an electronic device which is adapted to protect the LED filament is practicable, and a combination of an electronic device which is adapted to conduct electricity, an electronic device which is adapted to limit current, and an electronic device which is adapted to protect the LED filament is also practicable.

In the Examples 1-7, the strip substrate 11 is transparent or opaque. A transparent substrate is a sapphire substrate, a transparent ceramic substrate, a transparent glass substrate, or etc. An opaque substrate is an opaque ceramic substrate, a glass-ceramic substrate, a metallic substrate, or etc. The LED chips 12 are common chips. The LED chips 12 are blue chips, blue-violet chips, purple chips, or red chips. One kind of LED chips 12 or various kinds of LED chips can be bonded with and fixed on the strip substrate 11 via the die attach adhesive. In the specific design, optionally, the LED chips 12 are flip chips. The LED chips 12 is fixed on the strip substrate 11 by flip-chip bonding, meanwhile the LED chips 12 are connected to the printed circuit on which leads that are adapted to connect to the electronic devices are printed. Optionally, the metal strip electrode 13 is articulated with one end of the strip substrate 11, or is bonded with one end of the strip substrate 11. For a more reliable connection, the metal strip electrode 13 is articulated with, and is boned with one end of the strip substrate 11. For example, the metal strip electrode 13 is designed as follows: the metal strip electrode 13 comprises a connection end 131, and the metal strip electrode 13 is connected to one end of the strip substrate 11 via the connection end 131. The connection end 131 comprises an axial jack 132 which matches with the end of the strip substrate 11. The end of the strip substrate 11 is inserted in the jack 132, thus the end of the strip substrate 11 is connected to the jack 132, while in combination with the bonding process, the connection is more reliable. The metal strip electrode 13 is a copper-plated nickel electrode, a copper-plated silver electrode, an iron-plated nickel electrode, or an iron-plated silver electrode. The electronic devices are bonded on or soldered on the strip substrate 11. The leads are gold wires, gold-silver alloy wires, or copper-plated palladium wires, etc. The LED chips 12 are connected in series via conventional leads (the lead wire diameters are less than 25 μm (1 mil)) to form the LED light source. The electronic devices, the LED light source, and the metal strip electrode 13 are connected via leads. The fluorescent glue 19 is a uniform mixture of LED fluorescent powder and silica gel. The LED fluorescent powder is adapted to convert the light emitted from the LED chips 12 to the light having different colors which is combined with the light emitted from the LED chips 12 to form the white light. The silica gel is adapted to uniformly disperse the LED fluorescent powder. The strip substrate 11, the LED chips 12, the electronic devices, and joints between the strip substrate 11 and the metal strip electrodes 13 are coated with the fluorescent glue 19, with the metal strip electrode 13 exposed. Therefore, the fluorescent glue 19 can protect the LED chips 12, the electronic devices, and the leads.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. An LED filament, comprising:
   a strip substrate, the strip substrate comprising two ends;
   a plurality of LED chips;
   metal strip electrodes; and
   a plurality of electronic devices;
   wherein:
   the plurality of LED chips is disposed on the strip substrate and connected in series to form an LED light source;
   the metal strip electrodes are disposed on the two ends of the strip substrate;
   the plurality of electronic devices is disposed on the strip substrate in the vicinity of one end of the strip substrate or in the vicinity of the two ends of the strip substrate;
   the metal strip electrodes are connected to the electronic devices and the LED light source via leads;
   the strip substrate, the LED light source, the electronic devices, and joints between the strip substrate and the metal strip electrodes are coated with fluorescent glue;
   the electronic devices are disposed on the strip substrate in the vicinity of the two ends; the electronic devices are conductive blocks; a welding spot area of each conductive block is larger than an electrode area of each LED chip; a first conductive block is disposed between a first metal strip electrode and the LED light source; a second conductive block is disposed between the LED light source and a second metal strip electrode; and the first metal strip electrode, the first conductive block, the LED light source, the second conductive block, and the second metal strip electrode are connected in series via leads in that order; and
   the first metal strip electrode is connected to the first conductive block via a first lead; the second conductive block is connected to the second metal strip electrode via a second lead; a lead wire diameter of the first lead and the second lead is larger than 25 μm; each conductive block is a metallic conductive block, a nonmetallic conductive block, or a conductive block containing a conductive layer; and a welding surface of each conductive block is coated with a nickel layer or a silver layer.

2. An LED light bulb comprising one or a plurality of the LED filament of claim 1, and the LED light bulb further comprising:
   an LED drive power;
   a bulb holder;
   a glass bulb;
   a column; and
   an LED luminous body connected to the LED drive power;
   wherein:
   the LED drive power is disposed in the bulb holder;
   the one LED filament or the plurality of LED filaments is disposed in the LED luminous body, wherein the plurality of LED filaments is connected in series or in parallel; and
   the LED luminous body is mounted on the column disposed in the glass bulb having a sealed chamber filled with thermal transfer gas or protecting gas or inert gas.

3. An LED filament, comprising:
   a strip substrate, the strip substrate comprising two ends;
   a plurality of LED chips;

metal strip electrodes; and
a plurality of electronic devices;
wherein:
the plurality of LED chips is disposed on the strip substrate and connected in series to form an LED light source;
the metal strip electrodes are disposed on the two ends of the strip substrate;
the plurality of electronic devices is disposed on the strip substrate in the vicinity of one end of the strip substrate or in the vicinity of the two ends of the strip substrate;
the metal strip electrodes are connected to the electronic devices and the LED light source via leads;
the strip substrate, the LED light source, the electronic devices, and joints between the strip substrate and the metal strip electrodes are coated with fluorescent glue; and
two electronic devices are disposed on the strip substrate in the vicinity of one end of the strip substrate; one electronic device is a first conductive block, and the other electronic device is a current-limiting chip; a third electronic device is disposed on the strip substrate in the vicinity of the other end of the strip substrate; the third electronic device is a second conductive block; a welding spot area of each of the first conductive block and the second conductive block is larger than an electrode area of each LED chip; the first conductive block and the current-limiting chip are disposed between a first metal strip electrode and the LED light source, and the first conductive block is adjacent to the first metal strip electrode; the second conductive block is disposed between the LED light source and a second metal strip electrode; and the first metal strip electrode, the first conductive block, the current-limiting chip, the LED light source, the second conductive block, and the second metal strip electrode are connected in series via leads in that order.

4. An LED light bulb comprising one or a plurality of the LED filament of claim 3, and the LED light bulb further comprising:
an LED drive power;
a bulb holder;
a glass bulb;
a column; and
an LED luminous body connected to the LED drive power;
wherein:
the LED drive power is disposed in the bulb holder;
the one LED filament or the plurality of LED filaments is disposed in the LED luminous body, wherein the plurality of LED filaments is connected in series or in parallel; and
the LED luminous body is mounted on the column disposed in the glass bulb having a sealed chamber filled with thermal transfer gas or protecting gas or inert gas.

5. An LED filament, comprising:
a strip substrate, the strip substrate comprising two ends;
a plurality of LED chips;
metal strip electrodes; and
a plurality of electronic devices;
wherein:
the plurality of LED chips is disposed on the strip substrate and connected in series to form an LED light source;
the metal strip electrodes are disposed on the two ends of the strip substrate;
the plurality of electronic devices is disposed on the strip substrate in the vicinity of one end of the strip substrate or in the vicinity of the two ends of the strip substrate;
the metal strip electrodes are connected to the electronic devices and the LED light source via leads;
the strip substrate, the LED light source, the electronic devices, and joints between the strip substrate and the metal strip electrodes are coated with fluorescent glue; and
two electronic devices are disposed on the strip substrate in the vicinity of one end of the strip substrate; one electronic device is a first conductive block, and the other electronic device is a thermistor; a third electronic device is disposed on the strip substrate in the vicinity of the other end of the strip substrate; the third electronic device is a second conductive block; a welding spot area of each of the first conductive block and the second conductive block is larger than an electrode area of each LED chip; the first conductive block and the thermistor are disposed between a first metal strip electrode and the LED light source, and the first conductive block is adjacent to the first metal strip electrode; the second conductive block is disposed between the LED light source and a second metal strip electrode; and the first metal strip electrode, the first conductive block, the thermistor, the LED light source, the second conductive block, and the second metal strip electrode are connected in series via leads in that order.

6. An LED light bulb comprising one or a plurality of the LED filament of claim 5, and the LED light bulb further comprising:
an LED drive power;
a bulb holder;
a glass bulb;
a column; and
an LED luminous body connected to the LED drive power;
wherein:
the LED drive power is disposed in the bulb holder;
the one LED filament or the plurality of LED filaments is disposed in the LED luminous body, wherein the plurality of LED filaments is connected in series or in parallel; and
the LED luminous body is mounted on the column disposed in the glass bulb having a sealed chamber filled with thermal transfer gas or protecting gas or inert gas.

* * * * *